United States Patent

Purdes et al.

[15] 3,642,527

[45] Feb. 15, 1972

[54] METHOD OF MODIFYING ELECTRICAL RESISTIVITY CHARACTERISTICS OF DIELECTRIC SUBSTRATES

[72] Inventors: Andrew J. Purdes, Pawtucket, R.I.; Ernest M. Jost, Plainville, Mass.

[73] Assignee: Texas Instruments Incorporated, Dallas, Tex.

[22] Filed: Dec. 30, 1968

[21] Appl. No.: 787,989

[52] U.S. Cl. ....117/212, 117/223

[51] Int. Cl. ....B44d 1/18

[58] Field of Search ....106/39; 117/212, 213, 123, 117/223

[56] References Cited

UNITED STATES PATENTS

| | | | |
|---|---|---|---|
| 3,296,359 | 1/1967 | Ramsey, Jr. et al. | 117/212 X |
| 3,362,851 | 1/1968 | Dunster | 117/212 |
| 3,415,679 | 12/1968 | Chuss | 117/212 |
| 3,450,581 | 6/1969 | Shortes | 117/212 X |

*Primary Examiner*—Alfred L. Leavitt
*Assistant Examiner*—Wayne F. Cyron
*Attorney*—Harold Levine, Edward J. Connors, Jr., John A. Haug and James P. McAndrews

[57] ABSTRACT

The electrical resistivity characteristics of selected portions of a dielectric substrate, such as barium titanate, may be modified by first forming a relatively porous substrate which may be handled without breaking, as by prefiring the substrate, masking selected portions of the substrate with a material such as a photoresist material which will vaporize during final firing of the substrate, contacting the substrate with a solution of a first reactant, immersing at least a portion of the substrate in a solution of a second reactant which will react with the first reactant to precipitate in situ in a portion of the substrate a compound which is insoluble in the solutions and which is adapted to modify the electrical resistivity characteristics of the substrate, and thereafter firing the substrate at a temperature on the order of 1,400°–1,450° C. to reduce the porosity of the substrate and to incorporate the insoluble compound into the lattice of selected portions of the substrate. Where it is desired to dope selected portions of an undoped substrate to the desired thickness and form thick-film positive temperature coefficient (PTC) thermistors, the starting material may be an undoped barium titanate, for example, the solution of the first reactant may be an aqueous solution of a compound such as ammonium hydroxide, and the solution of the second reactant may be an aqueous solution of a compound such as lanthanum acetate which reacts with the ammonium hydroxide to precipitate lanthanum hydroxide in situ and thereby dope selected portions of the substrate. Where it is desired to produce areas of high-electrical resistivity in selected portions of the substrate, the starting material is a doped barium titanate, for example, the solution of the first reactant may be an aqueous solution of a compound such as ammonium hydroxide, and the solution of the second reactant may be an aqueous solution of a ferric compound such as ferric chloride which reacts with the ammonium hydroxide to precipitate in situ ferric hydroxide which, when fired, produces a high-resistivity area.

12 Claims, No Drawings

METHOD OF MODIFYING ELECTRICAL RESISTIVITY CHARACTERISTICS OF DIELECTRIC SUBSTRATES

This invention lies in the field of dielectric substrates and more particularly relates to improved methods of modifying the electrical resistivity characteristics of selected portions of dielectric substrates.

Heretofore, efforts to produce thick-film positive temperature coefficient (PTC) thermistors have involved the application of films of doped thermistor material to a substrate by methods such as silk screening and subsequent firing of the resulting film-substrate combination. Such film application techniques suffer from certain shortcomings. Thus, it has been difficult to achieve reproducibility of the mechanical and electrical characteristics of thermistors produced in this manner. Films which must be fired in order to achieve the desired electrical characteristics often crack due to nonuniform shrinkage. Cracking may also occur due to variations in thermal expansion between the film and the substrate during the normal conditions of temperature variations encountered in use. Thus, there has been a need for a practical method of producing thick-film positive temperature coefficient thermistors which permits effective control of the thickness of the doped layer and final thermistor thickness.

There have also been problems heretofore associated with electrically insulating surfaces on selected areas of a semiconducting substrate, particularly in providing thin insulating regions in the substrate.

Among the objects of the invention, therefore, may be mentioned the provision of an improved method of modifying the electrical resistivity characteristics of selected portions of a dielectric substrate; the provision of such a method which permits doping of selected portions of an undoped ceramic substrate to a desired thickness; the provision of a method of this type which also permits the production of areas of relatively high electrical resistivity in selected portions of a doped substrate; and the provision of such methods which may be readily and conveniently carried out and which permit controlled modification of the electrical resistivity characteristics of selected portions of a dielectric substrate. Other objects and features will be in part apparent and in part pointed out hereinafter.

The present invention is thus directed to the method of modifying the electrical resistivity characteristics of selected portions of a dielectric substrate which comprises first providing a dielectric substrate which may be handled without breakage, contacting the substrate with a solution of a first reactant, contacting at least a portion of the substrate with a solution of a second reactant which reacts with the first reactant to precipitate in situ in a portion of the substrate a compound which is insoluble in the aforesaid solutions and which is adapted to modify the electrical resistivity characteristics of the substrate, and causing the substrate to incorporate the insoluble compound into the lattice of selected portions of the substrate and thereby modifying the electrical resistivity characteristics of the selected portions of the substrate.

In one embodiment, the invention is more specifically directed to the method of doping selected portions of an undoped barium titanate substrate to a desired thickness by first forming a relatively porous barium titanate substrate which may be handled without breakage, contacting the substrate with a solution of a first reactant, introducing into at least a portion of the substrate a solution of a second reactant which reacts with said first reactant to precipitate in situ in a portion of the substrate a dopant compound which is insoluble in the solutions, and thereafter firing the substrate to reduce its porosity and to incorporate the insoluble dopant compound into the lattice of the substrate. In this embodiment, the first step of the method of the invention is to prepare the barium titanate substrate by pressing pure, undoped barium titanate powder to the desired shape and thickness. Preferably, the barium titanate powder is pressed to 50 percent of theoretical density so that the resulting substrate, in wafer form for example, is still relatively porous. The green substrate is then prefired at temperatures within the range 1,100°-1,300° C. for approximately 1 hour to produce a relatively porous substrate which may be easily handled without breakage and which does not soften in aqueous media.

The selected portions of the prefired substrate which are not to be doped are next masked by means of tape, plastic coating, photosensitive resist compositions or other suitable materials known to those in the art. Among suitable photosensitive resist compositions which may be utilized in the practice of the invention may be mentioned those marketed by Eastman Kodak Company under the trade designations KPR (KODAK Photo Resist), KMER (KODAK Metal-Etch Resist) and KTFR (KODAK Thin-Film Resist). It is highly preferable that the masking material be one which is adapted to be completely vaporized or burnt off during the final firing step described hereinafter.

Following the masking step, the prefired substrate is placed in a solution of a first reactant which may be ammonium hydroxide, for example, and allowed to become saturated by the solution. For most substrates, saturation requires approximately one-half hour. In order to effect doping of the unmasked portions of the substrate, the substrate is then placed in a solution of a second reactant, lanthanum acetate for example, which is adapted to react with the first reactant and precipitate in situ in the substrate and insoluble dopant compound, e.g., lanthanum hydroxide. Upon placing a substrate saturated with hydroxyl ions in a solution of a soluble lanthanum salt such as lanthanum acetate, the lanthanum ions diffuse into the substrate and are precipitated as lanthanum hydroxide. In this manner, the thickness of the doped layer (and the final thermistor thickness) can be readily controlled, being dependent upon the concentration of the two reactant solutions containing the hydroxyl and lanthanum ions and the period during which the substrate is contacted therewith. To determine the desired concentrations, a prefired substrate is weighed before and after saturation with water. Knowing the weight of water absorbed per weight of substrate, the proper concentration of the first reactant (e.g., ammonium hydroxide) may be readily computed for any desired dopant level. The lanthanum acetate solution may then be prepared so that stoichiometric proportions of lanthanum ions are available to react with the hydroxyl ions, i.e., one $La^{+3}$ ion is available to react with 3 $(OH)^-$ ions.

By precipitating an insoluble dopant compound in the substrate in this manner, films with the desired thickness and homogeneity may be obtained. On the other hand, if the substrate were introduced into a dopant solution without previously having been saturated with a solution of a first reactant such as ammonium hydroxide, the dopant compound would have entered the substrate by capillary action. This type of dopant uptake is extremely rapid and very difficult to control. Moreover, with this type of uptake, the doped substrate would redistribute the lanthanum ions during drying or firing thereby resulting in a film of nonhomogeneous resistivity or semiconductivity. With the method of the present invention, the lanthanum is precipitated as lanthanum hydroxide and the position of the lanthanum atoms remains fixed during drying.

To incorporate the insoluble dopant compound into the lattice of the surface layer of the substrate and produce semiconduction, the substrate is fired at a temperature of approximately 1,400°–1,450° C. for approximately 1 hour, preferably using a very slow heat and cool cycle. The final firing not only incorporates or fixes the dopant compound into the lattice of the substrate, but also functions to vaporize the masking material and the ammonium compound (ammonium acetate) formed during precipitation of lanthanum hydroxide. Further, the firing step reduces the porosity of the substrate to approximately 10 percent to provide a relatively hard final substrate.

As described above, the method of the first embodiment of the invention may be carried out utilizing a solution of ammonium hydroxide as the first reactant solution and a solution of lanthanum acetate as the second reactant solution. It will be understood that solutions of various water-soluble ammonium salts may be used in lieu of a solution of ammonium hydroxide and that solutions of various water-soluble lanthanum compounds may be employed in lieu of a solution of lanthanum acetate. For example, solutions of ammonium carbonate, ammonium oxalate and other ammonium compounds may be used to precipitate the dopant ions in situ. The use of ammonium compounds is preferred since they are readily removed during final firing. Also, the method may be carried out to introduce dopants other than lanthanum into substrates such as barium titanate substrates. Thus, dopants such as cerium, samarium, gadolinium and various trivalent rare earth elements known to the art may be introduced in the manner described through the use of soluble compounds thereof.

In further accordance with the invention, the prefired substrate may first be saturated with water instead of a solution of ammonium hydroxide. The substrate is then introduced into a lanthanum acetate solution for a time sufficient to give the desired film thickness. This is followed by placing the substrate into a solution of ammonium hydroxide to precipitate the lanthanum ions which had previously diffused into the substrate surface. Here again, the thickness of the doped layer obtained may be controlled through adjustments in the concentrations of the reactant solutions and the time of contact of the solutions with the substrate.

While, as previously mentioned, the use of solutions of ammonium compounds is preferred as the first reactant solution, various other compounds such as sodium hydroxide, potassium hydroxide and other sodium and potassium compounds may be employed in lieu thereof to precipitate an insoluble dopant compound in situ in the substrate. However, care must be taken to leach out the sodium or potassium ions prior to the final firing step since these ions would not vaporize upon firing.

Solvents other than water may be used to provide the solutions of the first and second reactants which react to precipitate an insoluble dopant compound in the substrate. The useful solvents must be solvents in which the reactants are soluble and in which the precipitated dopant compound is insoluble. The other reaction product formed in precipitation of the insoluble dopant compound should be vaporizable during the final firing of the substrate or be capable of being leached out prior thereto with a leaching solvent in which the dopant compound is insoluble.

The first embodiment of the present invention thus provides a practical method of producing discrete positive temperature coefficient (PTC) elements in the form of thick films on the order of milliinches thick and makes possible the production of films with the desired thickness and homogeneity.

In a second embodiment of the present invention, the method is provided for modifying the electrical resistivity characteristics of a dielectric substrate by producing areas of relatively high electrical resistivity in selected portions of the substrate. The method of this embodiment involves forming a relatively porous doped barium titanate substrate which may be handled without breakage, contacting the substrate with a solution of a first reactant, introducing into at least a portion of the substrate a solution of a second including a ferric compound and reactant which reacts with the first reactant to precipitate in situ in a portion of the substrate a ferric compound which is insoluble in the two reactant solutions and which is adapted to passivate or increase the electrical resistivity of the said portion of the substrate, and thereafter firing the substrate to reduce its porosity and to incorporate the insoluble ferric compound into the lattice of the substrate.

In the first step of the method of the second embodiment, a doped substrate, such as a lanthanum doped barium titanate, is formed in the desired shape through the use of a pellet press. In the pressing operation, the doped barium titanate is preferably pressed to 50 percent of theoretical density. The green pressed sample is then prefired at a temperature within the range 1,100°–1,300° C. for approximately 1 hour to produce a relatively porous substrate which may be readily handled without breakage and which does not soften in aqueous media. The pore volume of the substrate may be conveniently determined by saturating the sample with water and measuring the resultant increase in weight. A ratio of substrate weight to the weight of the water absorbed of about 5:1, for example, has been found satisfactory to work with in carrying out the practice of the invention.

The selected surface areas of the prefired substrate where electrical insulation is not desired are masked through the use of tape, plastic coating, photosensitive resist compositions or other suitable materials as previously described in connection with the first embodiment of the invention. The masked substrate sample is then immersed in a solution of a first reactant, ammonium hydroxide for example, until its pores become saturated. This generally requires one-half hour. After saturation with the ammonium hydroxide, the substrate is then immersed in a weak solution of a second reactant, ferric chloride ($FeCl_3 \cdot 6H_2O$) for example, which reacts with the first reactant to precipitate in situ an insoluble ferric compound, ferric hydroxide for example. Upon immersion in the solution of the second reactant, the ferric ions therefrom diffuse into the pores of the substrate through the ammonium hydroxide solution contained in the substrate and are precipitated as ferric hydroxide onto the walls of the pores. The depth of penetration of the ferric ions may be readily controlled by controlling the concentrations of the first and second reactant solutions and the time the substrate is contacted with the second reactant solution containing the ferric ions. In order to achieve the desired passivating effect on the substrate, a minimum amount of the insoluble ferric compound on the order of at least 0.2 percent should be introduced into the substrate.

The resulting substrate with the insoluble ferric compound precipitated therein is fired in air at a temperature of approximately 1,400°–1,450° C. for approximately 1 hour to effect sintering and to incorporate the insoluble ferric compound into the lattice of the substrate. The final firing step also vaporizes the masking material and ammonium compound (ammonium chloride) formed during precipitation of ferric hydroxide, and further reduces the porosity of the substrate to approximately 10 percent.

In lieu of ammonium hydroxide, solutions of other water-soluble ammonium compounds such as ammonium phosphate which will react with a water-soluble ferric compound to form an insoluble ferric compound, may be used in the practice of the invention. Similarly, various water-soluble ferric compounds may be used in place of ferric chloride as the source of the ferric ions required to form an insoluble ferric compound in situ as described.

Although the use of solutions of ammonium compounds as the solution of the first reactant is generally preferred since the remaining ammonium compound may be vaporized during the final firing step, solutions of compounds such as sodium hydroxide, potassium hydroxide and the like may also be employed as the first reactant solution. However, with the use of such compounds, it is necessary to remove the remaining sodium or potassium compound from the substrate, as by leaching, prior to final firing.

Alternatively to the procedure described above, the prefired substrate may first be saturated with water and then introduced into a solution of a soluble ferric compound for a time sufficient to give the desired concentration of ferric ions in the substrate. The substrate may then be placed in a solution of a reactant, such as ammonium hydroxide, which reacts with the ferric ions in the substrate to precipitate an insoluble ferric compound in situ.

Further, solvents other than water may be used to provide the solutions of the first and second reactants which react to precipitate an insoluble ferric compound in situ in the substrate. In order to be useful, such solvents must be solvents for the reactants but not for the precipitated ferric compound. The other reaction product formed in precipitation of the insoluble ferric compound should either be vaporizable during final firing or be capable of being leached out prior thereto.

The method of the second embodiment of the invention permits the obtainment of a maximum amount of passivation or electrical insulation of the substrate with a minimal thickness of the layer of insoluble ferric compound. For example, marked increases in the electrical resistivity of the doped substrate may be obtained with a depth of penetration of only about 2 to 3 mils. The small amount of insoluble ferric compound introduced into the substrate is sufficient to raise the room temperature resistivity of doped barium titanate from 50 ohm-cm. to about $10^{10}$ ohm-cm.

It will be understood that the invention may be carried out using various dielectric substrates. In place of barium titanate, other members of the titanate family such as barium strontium titanate ($BaSrTiO_3$) or barium lead titanate ($BaPbTiO_3$) may be employed.

The methods of the invention may be carried out to modify the electrical resistivity characteristics of the entire major surfaces of substrates or only of selected small areas of the substrates. However, where the ratio of the thickness of the substrate to the thickness of the doped or passivated layer applied through the invention is small (e.g., on the order of 2:1), there is a tendency for the substrate to undergo splitting and shrinkage during final firing where the applied layer covers the entire major surfaces of the substrate. This difficulty is not encountered where the ratio of the respective thicknesses is high (e.g., on the order of 10:1 or more) or where the applied layer covers selected small areas or portions of the substrate and the remaining areas are masked.

The following examples further illustrate the invention.

EXAMPLE 1

Powder of composition $BaTi_{1.03}O_3$ was mixed with 0.5 percent by weight of polyvinyl alcohol which acted as a binder. The powder was then formed in a pellet press into wafers approximately 1 inch in diameter by 2 mm. thick. The pressure employed in the pressing operation was such that the resulting wafers were approximately 50 percent of theoretical density. These green wafers were then prefired in a pusher-type globar furnace at a temperature of 1,300° C. for approximately 1 hour. Following the prefiring operation, the wafers were porous but could still be easily handled without breakage.

The areas of the wafers as to which a semiconducting layer was not desired were masked with a photosensitive resist composition (Kodak's KMER). The masked wafers were then immersed for one-half hour in a solution consisting of 1 ml. concentrated ammonium hydroxide per 370 ml. of distilled water. After removing the wafers from the ammonium hydroxide solution, they were quickly rinsed in distilled water and immersed for 10 minutes in a solution consisting of 0.4571 g. of lanthanum acetate per 100 ml. of distilled water.

After removing the wafers from the lanthanum acetate solution, they were fired in a pusher-type globar furnace at 1,450° C. at a rate of 9 inches per hour. During the firing operation, the lanthanum is incorporated into the barium titanate ($BaTi_{1.03}0_3$) lattice and the mask is vaporized. The resulting ceramic sample was semiconducting to a depth of 10 mils in the areas where no mask had been applied, the remainder of the sample being insulating. The semiconducting areas were readily distinguishable by their characteristic blue-grey color, the remainder of the sample being light tan in color. Contacts to the semiconducting areas of the sample could be made with electroless nickel, ultrasonic solder or other conventional methods.

EXAMPLE 2

As in Example 1, wafers of undoped barium titanate were pressed into the desired shape and prefired at a temperature of approximately 1,300° C. for approximately 1 hour. The wafers were then masked in the areas where semiconduction was not desired.

The masked wafers were then placed in a solution consisting of 1 ml. of concentrated ammonium hydroxide per 1,000 ml. of water for one-half hour. After removing the wafers from the ammonium hydroxide solution and rinsing it in distilled water, they were placed in a solution consisting of 1.47 g. of lanthanum acetate per 100 ml. of water for approximately 5 to 10 minutes. The wafers were then fired in air at a temperature of 1,450° C. for approximately 1 hour.

The resulting wafers exhibited sheet resistivities between 1 and 2 K ohms/square.

EXAMPLE 3

A green pressed sample of barium titanate doped with 0.2 molar percent lanthanum was prefired at a temperature of 1,200° C. for 1 hour in air. The desired mask was applied to the sample by means of a photosensitive resist composition and the sample was then immersed in a solution prepared by adding 1 ml. of concentrated ammonium hydroxide to 49.7 ml. of water.

After allowing the sample to become saturated with the ammonium hydroxide (one-half hour in solution), it was rinsed in distilled water. The sample was then placed in a solution prepared by dissolving 1.17 g. of ferric chloride ($FeCl_3 \cdot 6H_2O$) in 100 ml. of water. After immersion for 1 hour in the ferric chloride solution, the sample was rinsed and fired at a temperature of 1,450° C. in air for 1 hour.

The resulting fired sample had a high resistivity layer approximately 5 mils in thickness which could be visually observed, being light green in color as compared with the dark blue interior of the sample.

EXAMPLE 4

A wafer of barium titanate doped with 0.3 percent lanthanum was pressed to 50 percent theoretical density and prefired at a temperature of 1,200° C. for approximately 1 hour. The sample was then immersed in a solution consisting of 1 ml. of concentrated ammonium hydroxide per 25.0 ml. of water for one-half hour. After removing the sample from this solution, it was placed in a solution consisting of 1.17 g. of ferric chloride ($FeCl_3 \cdot 6H_2O$) per 100 ml. of water for 1 minute. The high concentration of hydroxyl ions $(OH)^-$ in the wafer insured that the ferric ions ($Fe^{+++}$) could diffuse only a very short distance into the sample before being precipitated as ferric hydroxide. The depth of penetration was approximately 2 to 3 mils.

After firing the resulting doped sample in air at a temperature of approximately 1,450° C. for 1 hour, the interior and masked surface areas were semiconducting with a resistivity of about 50 ohm-cm. The areas of the surface which were not masked were found to be insulating with resistances greater than $10^8$ ohms per square.

In view of the above, it will be seen that the several objects of the invention are achieved and other advantageous results attained.

As various changes could be made in the above methods without departing from the scope of the invention, it is intended that all matter contained in the above description shall be interpreted as illustrative and not in a limiting sense.

What is claimed is:

1. The method of modifying the electrical resistivity characteristics of selected portions of a barium titanate substrate comprising:

pressing barium titanate powder to a density less than 90 percent theoretical density and prefiring it at a temperature within the range of approximately 1,100°–1,300° C. to provide a barium titanate substrate which may be handled without breakage;

saturating the substrate with a solution of a first reactant selected from the group consisting of soluble compounds of ammonium salts, potassium and sodium;

placing at least a portion of the substrate into a solution of a second reactant selected from the group consisting of soluble compounds of lanthanum, cerium, samarium, gadolinium and other trivalent rare earth elements, which reactant reacts with said first reactant to precipitate in situ in at least a portion of the substrate a compound which is insoluble in said solutions and which is adapted to modify the electrical resistivity characteristics of the substrate; and firing the substrate at a temperature within the range of approximately 1,400°–1,450° C. for approximately 1 hour to incorporate said insoluble compound into the lattice of selected portions of the substrate and thereby modifying the electrical resistivity characteristics of said selected portions of the substrate.

2. The method of claim 1 wherein prior to saturating said substrate with a solution of said first reactant, selected portions of the substrate are masked with a material which is adapted to be vaporized, and said material is vaporized from the substrate during firing thereof.

3. The method of doping selected portions of an undoped barium titanate substrate to a desired thickness comprising:

forming a relatively porous barium titanate substrate which may be handled without breakage;

saturating the substrate with a solution of a first reactant selected from the group consisting of soluble compounds of ammonium salts, potassium and sodium;

placing into at least a portion of the substrate a solution of a second reactant selected from the group consisting of soluble compounds of lanthanum, cerium, samarium, gadolinium and other trivalent rare earth elements, which reactant reacts with said first reactant to precipitate in situ in at least a portion of the substrate a dopant compound which is insoluble in said solutions; and thereafter firing the substrate at a temperature within the range of approximately 1,400°–1,450° C. to reduce its porosity and to incorporate said insoluble dopant compound into the lattice of the substrate.

4. The method of claim 3 wherein prior to saturating said substrate with a solution of said first reactant, selected portions of the substrate are masked with a material which is adapted to be vaporized, and said material is vaporized from the substrate during said firing.

5. The method of claim 3 wherein a relatively porous barium titanate substrate is formed by pressing undoped barium titanate powder into a substrate of the desired shape and firing the pressed substrate at a temperature between approximately 1,100° and 1,300° C.

6. The method of claim 3 wherein the solution of said first reactant is an aqueous solution of a water soluble ammonium compound.

7. The method of claim 6 wherein the solution of said second reactant is an aqueous solution of a water soluble salt of a dopant cation.

8. The method of doping selected portions of an undoped barium titanate substrate to a desired thickness comprising:

forming a relatively porous barium titanate substrate which may be handled without breakage;

masking selected portions of said substrate with a material which is adapted to be vaporized;

saturating the substrate with a solution of a first reactant selected from the group consisting of soluble compounds of ammonium salts, potassium and sodium;

immersing at least a portion of the substrate in a solution of a second reactant selected from the group consisting of soluble compounds of lanthanum, cerium, samarium, gadolinium and other trivalent rare earth elements, which reactant reacts with said first reactant precipitate in situ in a portion of the substrate a dopant compound which is insoluble in said solutions; and thereafter firing the substrate to reduce its porosity and to incorporate said insoluble dopant compound into the lattice of the substrate.

9. The method of claim 8 wherein the solution of said first reactant is an aqueous solution of ammonium hydroxide.

10. The method of claim 9 wherein the solution of said second reactant is an aqueous solution of a lanthanum salt and the insoluble dopant compound is lanthanum hydroxide.

11. The method of claim 10 wherein a relatively porous barium titanate substrate is formed by pressing undoped barium titanate powder into a substrate of the desired shape under a pressure sufficient to reduce the porosity thereof no more than approximately 50 percent and thereafter firing the pressed substrate at a temperature between approximately 1,100° and 1,300° C.

12. The method of claim 11 wherein the final firing of the substrate is carried out at a temperature between approximately 1,400° and 1,450° C.

* * * * *